United States Patent [19]

Kashima et al.

[11] Patent Number: 5,754,951
[45] Date of Patent: May 19, 1998

[54] MICROWAVE MIXING CIRCUIT AND A DOWN CONVERTER COMPRISING IT

[75] Inventors: Yukiro Kashima, Takatsuki; Akira Kinoshita, Osaka, both of Japan

[73] Assignee: Matsushita Electric Industrial Co., Ltd., Osaka, Japan

[21] Appl. No.: 520,487

[22] Filed: Aug. 29, 1995

[30] Foreign Application Priority Data

Sep. 1, 1994 [JP] Japan ................... 6-208406

[51] Int. Cl.$^6$ .......................... H04B 1/26
[52] U.S. Cl. .............. 455/327; 455/313; 455/323; 455/325; 455/330; 333/104; 333/116
[58] Field of Search ................. 455/313, 317, 455/323, 324, 325, 326, 327, 330, 334, 337, 338, 341, 296, 303, 307, 333; 333/103, 104, 116

[56] References Cited

U.S. PATENT DOCUMENTS

| | | | |
|---|---|---|---|
| 3,634,768 | 1/1972 | Carpenter et al. | 455/326 |
| 4,593,411 | 6/1986 | Schiller | 455/323 |
| 4,596,047 | 6/1986 | Watanabe et al. | 455/327 |
| 4,959,873 | 9/1990 | Flynn et al. | |
| 4,996,718 | 2/1991 | Shiomi | 455/327 |
| 5,153,469 | 10/1992 | Petted et al. | 455/326 |
| 5,428,839 | 6/1995 | Friesen et al. | 455/326 |
| 5,446,923 | 8/1995 | Martinson et al. | 455/317 |
| 5,471,664 | 11/1995 | Kim | 455/327 |
| 5,493,718 | 2/1996 | Bayruns et al. | 455/323 |

FOREIGN PATENT DOCUMENTS

| | | |
|---|---|---|
| 0 317 642 | 5/1989 | European Pat. Off. |
| 57-197902 | 12/1982 | Japan |
| 61-101133 | 5/1986 | Japan |

OTHER PUBLICATIONS

European Search Report dated Feb. 24, 1992.

*Primary Examiner*—Reinhard J. Eisenzopf
*Assistant Examiner*—Doris To
*Attorney, Agent, or Firm*—Ratner & Prestia

[57] ABSTRACT

A microwave mixing circuit of a small size for selecting a signal to be received out of plural microwave signal inputs, and converting it to an intermediate frequency signal, and a down converter comprising it are provided. A microwave input signal within a band of 12 GHz applied to one microwave signal input unit is guided through a bias terminal from a comparator into a mixer diode to which a bias current is supplied, and is converted in frequency by the mixer diode. A microwave input signal applied to other microwave signal input unit is guided through the bias terminal from the comparator into a mixer diode to which bias current is not supplied, and is hence not converted in frequency by the mixer diode. As a result, only an intermediate frequency signal of 1 GHz band corresponding to the former microwave signal appears at the intermediate frequency signal output terminal.

11 Claims, 4 Drawing Sheets

MICROWAVE MIXING CIRCUIT AND A DOWN CONVERTER COMPRISING IT

FIELD OF THE INVENTION

The present invention relates to a microwave mixing circuit used in a down converter and the like for receiving satellite broadcasting or communication signals from broadcasting and communication satellites and a down converter containing the circuit for receiving satellite broadcasting and communication signals.

PRIOR ART

Recently, together with an expansion of the satellite communication, as broadcasting through broadcasting satellites (BS) has come to be widely used, and broadcasting service using communication satellites (CS) has been started as well, opportunities for directly receiving plural satellite signals at home have been widened.

Accordingly, reduction in size and cost of antennas for receiving such signals has been demanded. Besides, for broadcasting and communication by using CS, because channel multiplexing is conducted by using radio waves of different polarizations (horizontal and vertical polarizations) at a same frequency to effectively make use of frequencies, in many cases, a low-noise down converter capable of switching between the polarizations is employed.

A microwave mixing circuit for use in a conventional down converter is described below.

FIG. 4 shows an example of conventional microwave mixing circuit.

A local oscillatory signal (for example, of an oscillating frequency of 11.2 GHz) is directed from a local oscillator 3 through band-pass filters (hereinafter abbreviated as BPFs) 4 and 5 passing a local frequency to microstrip lines (hereinafter MSLs) 6 and 7.

Microwave input signals vertically and horizontally polarized in a band of 12 GHz are, as they are applied to microwave signal input units 1 and 2, supplied together with the local oscillatory signals through MSL 6 and 7 to Schottky barrier diodes (hereinafter SBDs) SBDs 8 and 9 that serve as mixer diodes for the frequency conversion, mixed by the SBDs 8 and 9, and converted by them, respectively, to intermediate frequency signals of a band of 1 GHz.

Here, biasing terminals 10 and 11 connected to anodes of the SBDs 8 and 9 apply a bias current in the forward direction to the SBDs 8 and 9 in order to prevent increase of a conversion loss at a low power level of local oscillatory signal output supplied from the local oscillator 3. The intermediate frequency signals passing low pass filters (hereinafter LPFs) 12 and 13 that allows the intermediate frequency signals to pass therethrough are amplified by intermediate frequency signal amplifiers 34, 35 and 36, 37. The intermediate frequency signals are selected by pin diodes 38, 39, and pass therethrough.

After selectively passing through the pin diodes 38, 39, the intermediate frequency signals are amplified by intermediate frequency signal amplifiers 40 and 41, and outputted from an intermediate frequency signal output terminal 45 to outside.

On the other hand, a supply voltage for a microwave mixing circuit and intermediate frequency amplifiers and a DC voltage of polarization switching control signal are supplied through the intermediate frequency signal output terminal 45 from outside.

Power supply terminals of the intermediate frequency amplifiers 34, 35 and an anode of the pin diode 38 are connected to a polarization switching control terminal 46, which, in turn, is connected to a comparator 44 for outputting DC signals of two different values according to a DC voltage (for example, 11 V or 15 V) that is supplied from outside through the intermediate frequency signal output terminal 45 and a collector of transistor 42 connecting an output of the comparator to a base. Similarly, power supply terminals of the intermediate frequency amplifiers 36, 37 and an anode of the pin diode 39 are connected to a polarization switching control terminal 47, which, in tern, is connected to a comparator 44 for outputting DC signals of two different values according to a DC voltage (for example, 11 V or 15 V) that is supplied from outside through the intermediate frequency signal output terminal 45 and an emitter of transistor 43 that connecting an output of the comparator to a base.

In the case a DC voltage of 11 V is supplied by the intermediate frequency signal output terminal 45, because the transistor 42 is turned on, and the transistor 43 is simultaneously turned off through the comparator 44 by the DC voltage, a power supply to the intermediate frequency amplifiers 34, 35 and the pin diode 38 are turned on, while that to the intermediate frequency amplifiers 36, 37 and the pin diode 39 are turned off. Therefore, an intermediate frequency signal corresponding to a vertical polarized microwave signal applied by the microwave signal input unit 1 is inputted to the intermediate frequency amplifiers 40 and 41, amplified to a desired level in the intermediate frequency amplifiers 40 and 41, and outputted from the intermediate frequency signal output terminal 45.

In a similar manner, in the case a DC voltage of 15 V is supplied by the intermediate frequency signal output terminal 45, because the transistor 42 is turned off, and the transistor 43 is simultaneously turned on by the DC voltage through the comparator 44, the power supply to the intermediate frequency amplifiers 34, 35 and the pin diode 38 are turned off, while that to the intermediate frequency amplifiers 36, 37 and the pin diode 39 are turned on. Thus, an intermediate frequency signal corresponding to a horizontal polarized microwave signal applied by the microwave signal input unit 2 is inputted to the intermediate frequency amplifiers 40 and 41, amplified to a desired level in the intermediate frequency amplifiers 40 and 41, and outputted from the intermediate frequency signal output terminal 45.

However, since the intermediate frequency amplifiers 34, 35, 36, 37 and pin diodes 38, 39 corresponding to the microwave signal input units 1, 2 for receiving two different polarized waves are required, such conventional arrangement has posed a difficulty in reducing the size of a microwave mixing circuit and a down converter containing it, and has been simultaneously disadvantageous in terms of a cost.

SUMMARY OF THE INVENTION

The present invention has been achieved to solve the problems, and it is an object of the invention to provide a microwave mixing circuit smaller in size and less expensive and a down converter containing the circuit.

In order to achieve the object, a microwave mixing circuit and a down converter containing it is characterized in that only a specified microwave signal is selected from plural microwave signal inputs, and converted to an intermediate frequency signal by designating the polarity of a bias current supplied to SBDs to be positive or negative by means of a simplified bias switching circuit using a comparator.

According to such arrangement, by switching the bias current supplied to a plurality of different SBDs between positive and negative polarities, the following effects can be obtained.

In the case a positive bias current is supplied to the SBD, a preferable matching is achieved with respect to a microwave signal input, a reflection loss is, therefore, minimized, and a conversion loss at a low power level of local oscillatory signal output that is supplied from a local oscillator is minimal.

On the contrary, in the case a negative bias current is supplied to the SBD, it is mismatched with a microwave signal input, the reflection loss is, therefore, increased, and a conversion loss at a low power level of local oscillatory signal output is significantly increased.

Thus, a specified microwave signal is selected out of plural microwave signal inputs for conversion.

DETAILED DESCRIPTION OF THE INVENTION

1st Exemplary Embodiment

Figure 1:
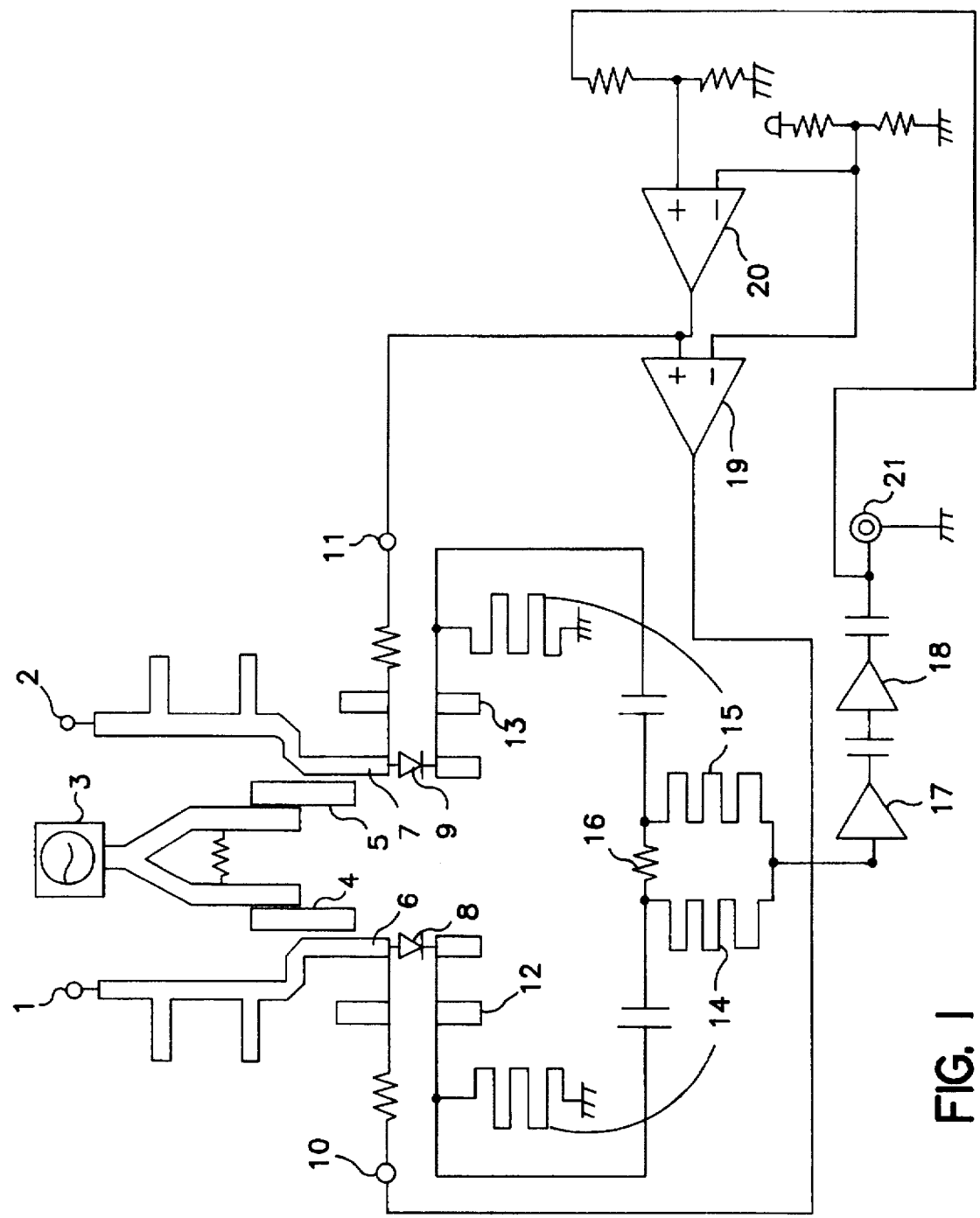
FIG. 1 is a first embodiment of a microwave mixing circuit according to the invention.

By referring to the drawings, an embodiment according to the invention is described below.

FIG. 1 shows a first embodiment of a microwave mixing circuit according to the invention.

In FIG. 1, microwave signal input units 1 and 2 are for receiving inputs of microwave signals vertically and horizontally polarized within a band of 12 GHz, respectively.

A local oscillatory signal (for example, of an oscillating frequency of 11.2 GHz) is directed from a local oscillator 3 through band-pass filters (hereinafter abbreviated as BPFs) 4 and 5 for allowing local frequencies to pass therethrough to a microstrip lines (hereinafter MSLs) 6 and 7.

Microwave input signals vertically and horizontally polarized in a band of 12 GHz are, as they are applied to microwave signal input units 1 and 2, supplied together with the local oscillatory signals through MSL 6 and 7 to Schottky barrier diodes (hereinafter SBDs) SBDs 8 and 9 that serve as mixer diodes for the frequency conversion, mixed by the SBDs 8 and 9, and converted by them, respectively, to intermediate frequency signals within a band of 1 GHz.

The intermediate frequency signals is applied through low pass filters 12, 13 for allowing intermediate frequency signals to pass therethrough and a Wilkinson-type divider (described later) consisting of MSLs 14 and 15 with a line length of ¼ a wavelength of the intermediate frequency signal within the band of 1 GHz and an absorption resistance 16 to an intermediate frequency amplifier 17.

The Wilkinson-type divider employed therein is capable of separating the intermediate frequency signals mixed and converted by the SBDs 8 and 9 without interference between each other, because the signals are mutually prevented from entering to a circuit of the other signal, and allows them to be directed to the intermediate frequency amplifier 17.

An output of the intermediate frequency amplifier 17 is further amplified by an intermediate frequency amplifier 18, and given from an intermediate frequency signal output terminal 21 to the outside.

On the other hand, a supply voltage to the microwave mixing circuit and intermediate frequency amplifiers and a polarization switching control signal (for example, a DC voltage of 11 V or 15 V) are supplied from outside (for example, a tuner for receiving satellite signals) through the intermediate frequency signal output terminal 21. The polarization switching control signal is applied to a comparator 20. An output of the comparator 20 is reversed by a comparator 19, and supplies a voltage of reverse polarity to bias terminals 10 and 11. In other words, the comparators 19 and 20 for a bias switching circuit for switching a polarity of bias current that is supplied to the bias terminals 10, 11.

In the case a bias voltage in the forward direction is applied to the SBDs 8 and 9, as described above, because a current flows in the forward direction, a preferable matching is obtained with respect to a microwave signal input, a reflection loss is, therefore, minimized, and a conversion loss at a low power level of local oscillatory signal output supplied by the local oscillator 3 is very low. On the contrary, in the case a negative bias voltage is applied, because a negative bias current flows through the SBDs, it is mismatched with a microwave signal input, the reflection loss is, therefore, increased, and a conversion loss at a low power level of local oscillatory signal output is significantly increased.

First, conditions when a DC voltage of 15 V is supplied to the intermediate frequency signal output terminal 21 is described.

A microwave signal horizontally polarized within a band of 12 GHz is directed to the MSL 7 together with a local oscillating frequency (11.2 GHz, for example) supplied through the BPF 5 from the local oscillator, as it is applied to the microwave signal input unit 2.

A positive voltage corresponding to the DC voltage of 15 V supplied by the intermediate frequency signal output terminal 21 is applied by the comparator 20 through the bias terminal 11 to the SBD 9 that is connected to the MSL 7.

By the application of such positive voltage, because a current flows in the forward direction in the SBD 9, as described, a preferable matching with respect to a microwave signal input is achieved, a reflection loss is, therefore, minimized, and a conversion loss at a low power level of local oscillatory signal output supplied by the local oscillator 3 is very low.

In such manner, a microwave input signal horizontally polarized is converted to an intermediate frequency signal within a band of 1 GHz, and the intermediate frequency signal corresponding to the horizontal polarized electromagnetic wave is directed to the MSL 15 after passing through the LPF 13.

On the other hand, a microwave signal vertically polarized within a band of 12 GHz is directed to the MSL 6 together with the BPF 4, as it is applied to the microwave signal input unit 1.

A negative voltage is supplied by the comparator 19 for reversing the polarity through the bias terminal 10 to the SBD 8 that is connected to the MSL 6.

As described, because a current flows in the reverse direction in the SBD 8, It is mismatched with the microwave signal input, the reflection loss is, therefore, increased, and a conversion loss at a low level of local oscillatory signal output is also significantly increased. Therefore, the microwave signal vertically polarized within the band of 12 GHz is subjected to almost no frequency conversion, and an intermediate frequency signal thereof passing the LPF 12 and appearing at the MSL 14 is insignificant.

The MSL 14 and MSL 15, together with the absorption resistance 16, form a Wilkinson-type divider, and an isolation is assured between lines.

Thus, in the input side of intermediate frequency amplifier 17, the intermediate frequency signal within the band of 1 GHz which corresponds to the vertical polarized electromagnetic wave applied to the microwave signal input unit 1 is suppressed, only the intermediate frequency signal within the band of 1 GHz which corresponds to the horizontal polarized electromagnetic wave applied to the microwave signal input unit 2 appears, is amplified to a desired level by the intermediate frequency amplifiers 17 and 18, and outputted, thereafter, from the intermediate frequency signal output terminal 21.

On the other hand, in the case a DC voltage of 11 V is supplied from the intermediate frequency signal output terminal 21, the comparator 20 applies a negative voltage to the bias terminal 11, while the comparator 19 for reversing the polarity applies a positive voltage to the bias terminal 10, and a bias current in the SBD 9 is, therefore, changed to be in the negative polarity as soon as a bias current in the SBD 8 is changed to be in the positive polarity.

In such manner, the intermediate frequency signal within the band of 1 GHz which corresponds to the horizontal polarized electromagnetic wave applied to the microwave signal input unit 2 is suppressed, as described, and only the intermediate frequency signal corresponding to the vertical polarized electromagnetic wave that is applied to the microwave signal input unit 1 is outputted from the intermediate frequency signal output terminal 21.

As described above, a microwave mixing circuit according to the invention can be provided at a lower cost, and reduced in size, in comparison with a conventional one, because it is very simple, capable of selecting a specified microwave signal out of plural microwave signals for conversion.

2nd Exemplary Embodiment

By referring to the drawings, a second embodiment of a microwave mixing circuit according to the invention is now described. The second embodiment is shown in FIG. 2.

Figure 2:
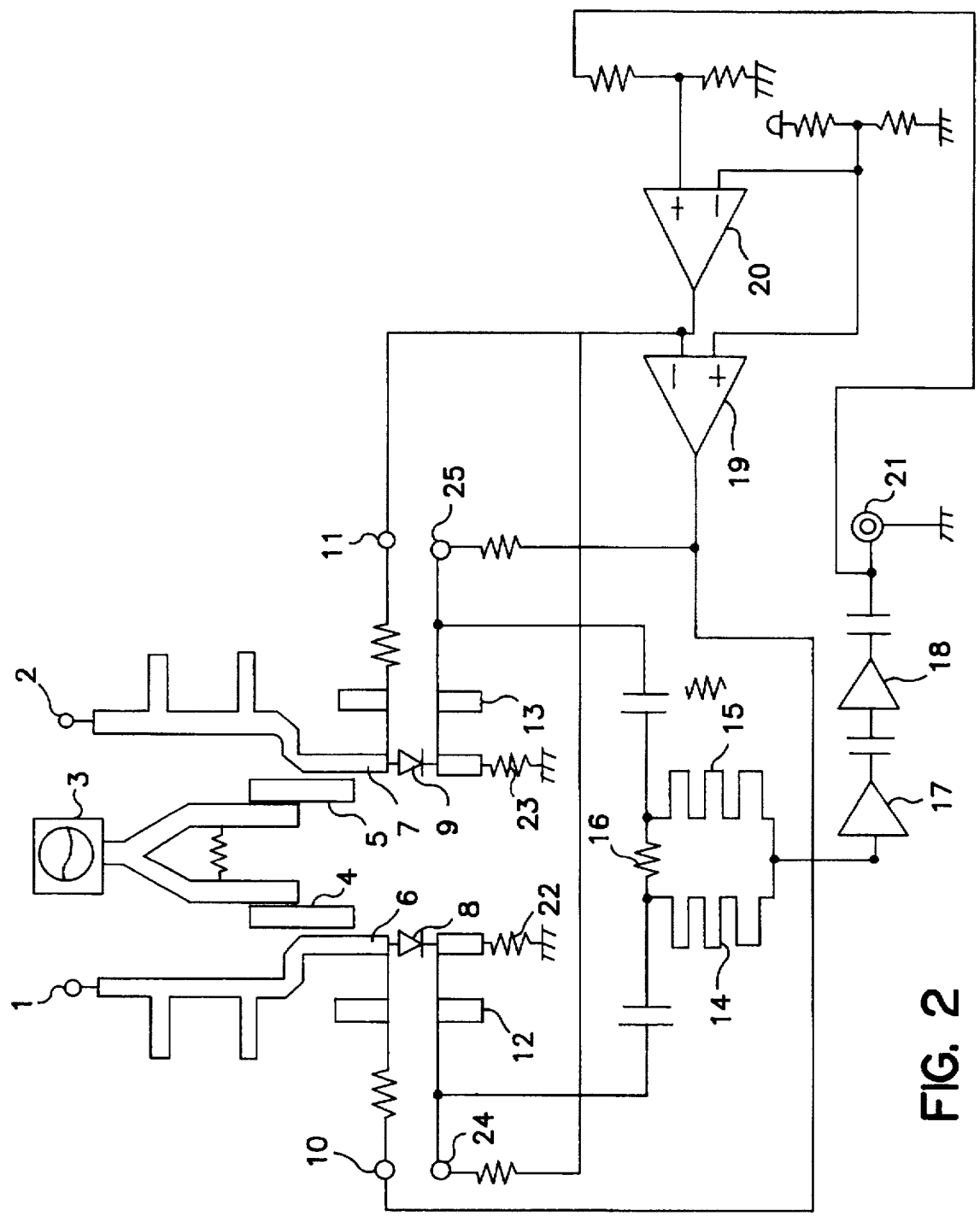
FIG. 2 is a second embodiment of a microwave mixing circuit according to the invention.

In FIG. 2, as reference numerals identical to those of FIG. 1 depict identical components serving for identical functions, they are not described here.

What is different from Embodiment 1 (FIG. 1) is that load resistances 22, 23 connected to bias terminals 24, 25 and cathodes of SBD 8 and 9 are additionally provided to apply a bias to the cathodes of SBD 8 and 9 by means of comparators 19 and 20.

In the case two, positive and negative, power supplies are provided to the comparators 19 and 20, outputs of the comparators are two, positive and negative, voltages. In the case of a single power supply with one of the power supplies being positive or negative and the other grounded, it is known that outputs of the comparators are two, high and low, voltages of an identical polarity. That is, two outputs of the former comparators come to be two, positive and negative, voltages, while those of the latter comparators are absolutely high voltage and low voltage of an identical polarity. A microwave mixing circuit with two, positive and negative, power supplies is described below. That with a single power supply is not described here, because it is obvious that effects identical to those with two power supplies can be obtained even with a single power supply.

Operations of a microwave mixing circuit and an intermediate frequency amplifier arranged in such manner are now described.

First, when a DC voltage of 15 V is supplied to an intermediate frequency signal output terminal 21 is described.

A microwave signal horizontally polarized within a band of 12 GHz that is applied to a microwave signal input unit 2 is directed, together with a local oscillating frequency (11.2 GHz, for example) supplied through a BPF 5 by a local oscillator 3, to a MSL 7.

A positive voltage corresponding to the DC voltage of 15 V that is supplied by the intermediate frequency signal output terminal 21 is applied by the comparator 20 through a bias terminal 11 to an anode of an SBD 9 that is connected to the MSL 7, and a negative voltage is simultaneously applied by the comparator 19 through a bias terminal 25 to a cathode of the SBD 9.

By the voltage application, because a current flows in the forward direction in the SBD 9, a preferable matching with respect to a microwave signal input is achieved, a reflection loss is, therefore, minimized, and a conversion loss at a low power level of local oscillatory signal output supplied by the local oscillator 3 is very low. In this way, the microwave signal horizontally polarized within the band of 12 GHz is converted to an intermediate frequency signal within a band of 1 GHz, and the intermediate frequency signal corresponding to the horizontal polarized electromagnetic wave passes through an LPF 13, and directed, thereafter, to an MSL 15.

On the other hand, a microwave signal vertically polarized within a band of 12 GHz that is applied to a microwave signal input unit 1 is directed, together with a local oscillating frequency (11.2 GHz, for example) supplied through a BPF 5 by the local oscillator 3, to an MSL 7.

A negative voltage corresponding to the DC voltage of 15 V that is supplied by the intermediate frequency signal output terminal 21 is applied by the comparator 19 through a bias terminal 10 to an anode of SDB 8 connected to an MSL 6, and a positive voltage is simultaneously applied to a cathode of SBD 8 by the comparator 20 through a bias terminal 24. By the voltage application, a current flows in the forward direction in the SBD 8, it is mismatched with a microwave signal input, the reflection loss is, therefore, increased, and a conversion loss at a low power level of local oscillatory signal output is significantly increased. Therefore, the microwave signal vertically polarized within the band of 12 GHz is subjected to almost no frequency conversion, and an intermediate frequency signal thereof passing an LPF 12 and appearing at an MSL 14 is insignificant.

The MSL 14 and MSL 15, together with the absorption resistance 16, form a Wilkinson-type divider, and an isolation is assured between lines.

Thus, in the input side of intermediate frequency amplifier 17, only the intermediate frequency signal within the band of 1 GHz which corresponds to the horizontal polarized electromagnetic wave applied to the microwave signal input unit 2 appears, is amplified to a desired level by the intermediate frequency amplifiers 17 and 18, and outputted, thereafter, from the intermediate frequency signal output terminal 21.

Similarly, in the case a DC voltage of 11 V is supplied from the intermediate frequency signal output terminal 21, because a bias in the forward direction is applied to the SBD 8, and a bias in the reverse direction is simultaneously applied to the SBD 9, an intermediate frequency signal corresponding to the vertical polarized electromagnetic wave is outputted from the intermediate frequency signal output terminal 21.

In the first and second emodiments, by eliminating the absorption resistance 16 forming the Wilkinson-type divider, respectively, and selecting line lengths of the microstrip lines 14 and 15 to avoid interference of impedances with each other, similar effects can be obtained.

As described above, a microwave mixing circuit according to Embodiment 2 can be composed of even simpler circuit, and provides for reduction in cost and size in comparison with that of Embodiment 1, because a bias switching circuit comprises merely by comparators (generally incorporated in a one-chip IC), and the comparators 19 and 20 can be supplied by a single power supply.

3rd Exemplary Embodiment

Now, a down converter provided with a microwave mixing circuit according to the embodiments is described below by referring to the drawings.

Figure 3:
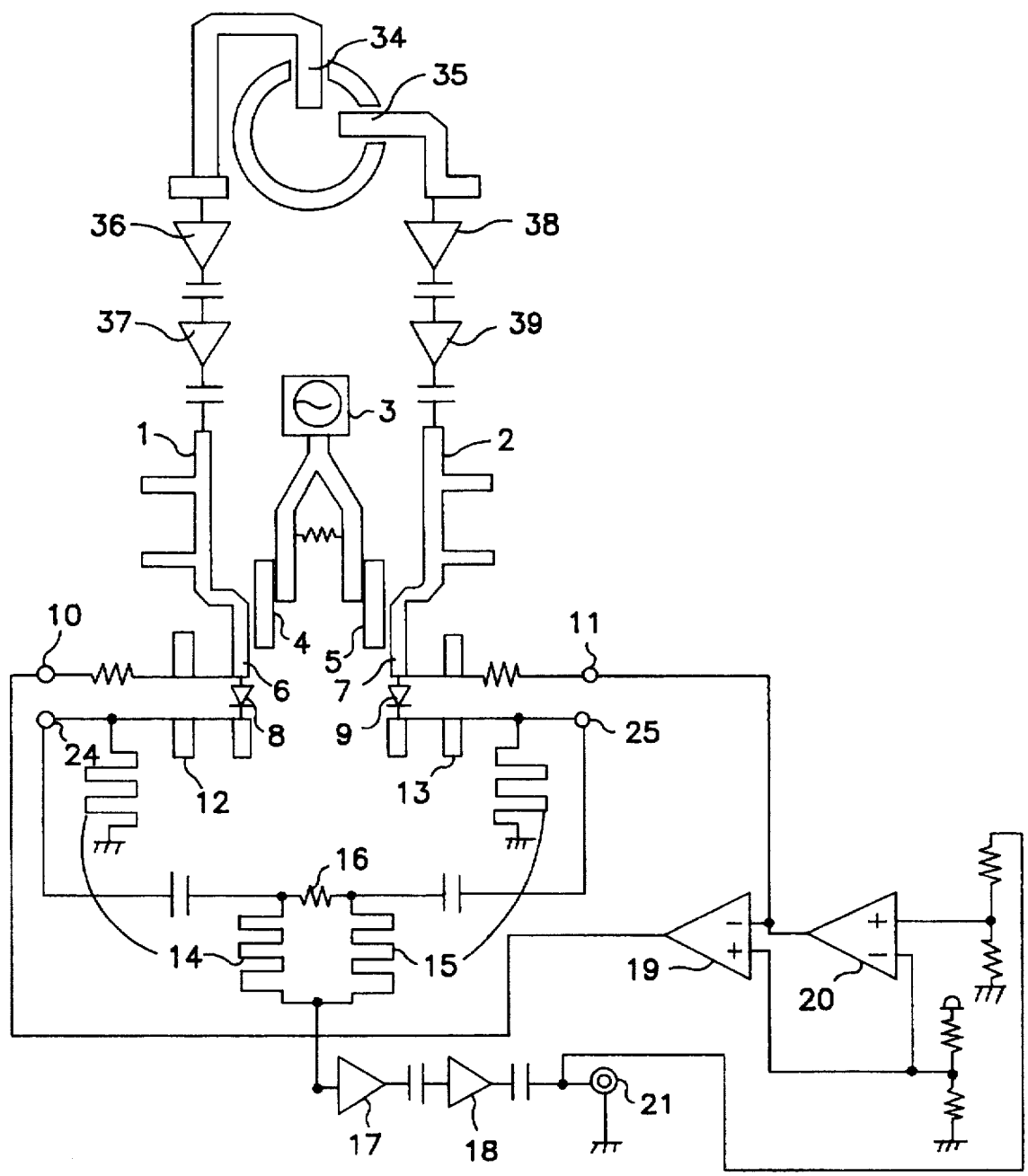
FIG. 3 is an embodiment of a down converter according to the invention.
Figure 4:
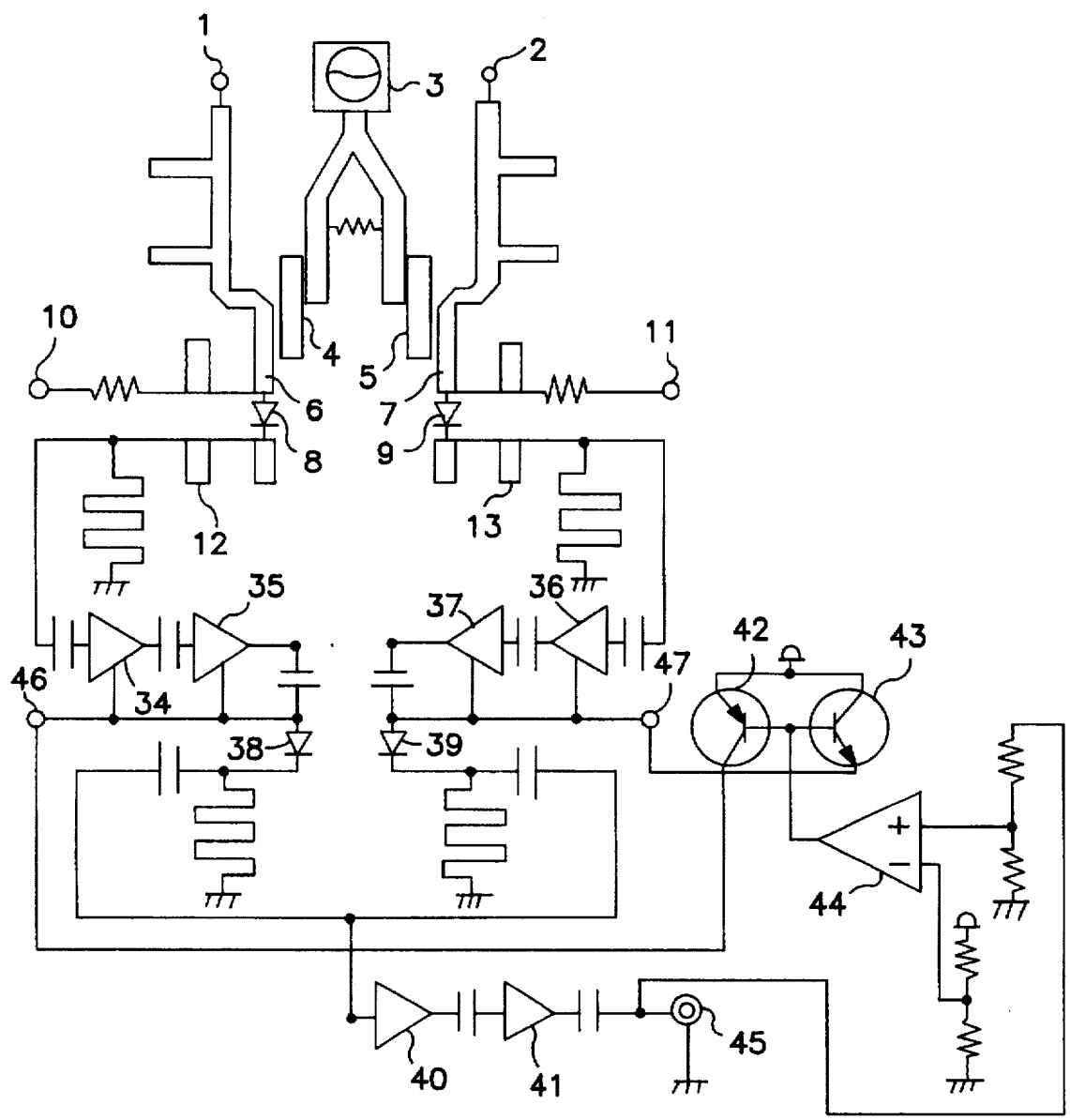
FIG. 4 is a conventional microwave mixing circuit.

FIG. 3 shows an embodiment of down converter circuit for receiving satellite broadcasting and communication signals according to the invention.

In FIG. 3, reference numerals identical to those of FIG. 1 depict identical components serving for identical functions, and are, therefore, not described here.

Operation of the down converter is described.

First, when a DC voltage of 15 V is supplied to an intermediate frequency signal output terminal 21 is described.

A horizontal polarized microwave signal emitted by a satellite is converted to a quasi-transverse electromagnetic wave for transferring a microstrip line by a probe 35 that converts a microwave signal within a band of 12 GHz to a quasi-transverse electromagnetic wave for transferring a microstrip line, subjected to a low noise amplification by low noise amplifiers 38 and 39 comprising such low noise devices as high electron mobility transistor, and then applied to a microwave signal input unit 2.

On the other hand, a vertical polarized microwave signal emitted by the satellite is converted to a quasi-transverse electromagnetic wave for transferring a microstrip line by a probe 34 that converts a microwave signal within a band of 12 GHz to a quasi-transverse electromagnetic wave for transferring a microstrip line, subjected to a low noise amplification by low noise amplifiers 36 and 37 comprising such low noise devices as high electron mobility transistor, and then applied to a microwave signal input unit 1.

The horizontal polarized microwave signal within the band of 12 GHz applied to the microwave signal input unit 2 is directed, together with a local oscillating frequency (11.2 GHz, for example) supplied through a BPF 5 by a local oscillator 3, to an MSL 7.

A positive voltage corresponding to the DC voltage of 15 V that is supplied by the intermediate frequency signal output terminal 21 is applied by a comparator 20 through a bias terminal 11 to an SBD 9 connected to the MSL 7.

By application of the positive voltage, because a current flows in the forward direction in the SBD 9, as described, a preferable matching is obtained with respect to the microwave signal input, a reflection loss is, therefore, minimized, and a conversion loss at a low power level of local oscillating signal output that is supplied by the local oscillator 3 is very low.

In such manner, the horizontal polarized microwave input signal is converted to an intermediate frequency signal within a band of 1 GHz, and the intermediate frequency signal corresponding to the horizontal polarized electromagnetic wave is directed to an MSL 15, after passing through an LPF 13.

The vertical polarized microwave signal within the band of 12 GHz applied to the microwave signal input unit 1 is directed to an MSL 6, together with a local oscillating frequency (11.2 GHz, for example) supplied through a BPF 4 by the local oscillator 3. A positive voltage corresponding to the DC voltage of 15 V supplied by the intermediate frequency signal output terminal 21 is applied by a comparator 19 through a bias terminal 10 to an SBD 8 connected to the MSL 6.

By application of the negative voltage, because a current in the reverse direction flows in the SBD 8, as described, it is mismatched with the microwave signal input, the reflection loss is, therefore, extremely increased, and a conversion loss at a low power level of local oscillatory signal output supplied by the local oscillator 3 is significantly increased.

In this way, the vertical polarized microwave signal is subjected to almost no frequency conversion, and an intermediate frequency signal thereof passing through an LPF 12 and appearing at an MSL 14 is insignificant.

The MSL 14 and 15, together with an absorption resistance 16, form a Wilkinson-type divider, and an isolation is assured between lines.

Therefore, only the intermediate frequency signal within the band of 1 GHz corresponding to the horizontal polarized microwave input signal that is obtained by the probed 35 appear in the input side of intermediate frequency amplifier 17, is amplified to a desired level by the intermediate frequency amplifiers 17 and 18, and then outputted from the intermediate frequency signal output terminal 21.

In the case a DC voltage of 11 V is supplied by the intermediate frequency signal output terminal 21, because a bias current in the SBD 9 is changed to be negative as soon as a bias current in the SBD 8 is changed to be positive, only the intermediate frequency signal corresponding to the vertical polarized electromagnetic wave that is converted to the quasi-transverse electromagnetic wave by the prove 34 is outputted from the intermediate frequency signal output terminal 21.

Although such case has been described above that an anode of the SBD is connected to a microstrip line of the microwave input, and a cathode to the intermediate frequency output, it is, of course, appreciated that the microwave input signal switching circuit is operative correspondingly in a similar manner, even when the SBD is at a reverse polarity.

As described, a down converter containing a microwave mixing circuit according to the invention can be designed to be reduced in size and weight, since the mixing circuit is very simple in comparison with a conventional one. Such reduction in size and weight brings about a very high economic effect to a down converter that is often installed outdoors.

Accordingly, the invention provides a less expensive and smaller microwave mixer capable of selecting a desired signal out of plural microwave input signals, and converting it to an intermediate frequency signal by additionally providing bias terminals for supplying a bias to SBDs and a bias switching circuit of simple structure for switching a polarity of bias current supplied to the biases and a down converter containing it.

What is claimed is:

1. A microwave mixing circuit comprising:
   a plurality of microstrip lines for inputting different microwave signals;
   a plurality of diodes, each anode of the diodes is coupled to a respective terminal end of said microstrip lines, for frequency converting one of said input microwave signals to an intermediate frequency signal which is output at one of the cathodes of said diodes;

bias terminals for supplying a bias current to each of the anodes of said diodes;

a bias switching circuit for selecting and controlling one of said diodes for said frequency converting by switching the polarities of the bias currents supplied to said bias terminals; and a common intermediate frequency signal output for outputting said intermediate frequency signal corresponding to the microwave signal selected at said bias switching circuit from the cathodes of said diodes.

2. A microwave mixing circuit of claim 1, wherein a Wilkinson-type divider is provided between the cathodes of diodes and the intermediate frequency signal output.

3. A microwave mixing circuit according to claim 1, further comprising a further plurality of microstrip lines, each having a respective first end coupled to a cathode of a respective one of said diodes and a respective second end coupled to said common intermediate frequency signal output.

4. A down converter comprising:

probes for converting inputting microwave signals into transverse electromagnetic waves;

a plurality of low noise amplifiers for amplifying the signals converted at said probes;

a plurality of microstrip lines for inputting different microwave signals;

a plurality of diodes, each anode of the diodes is coupled to a respective terminal end of said microstrip lines, for frequency converting one of said input microwave signals to an intermediate frequency signal which is output at one of the cathodes;

bias terminals for supplying a bias current to each of the anodes of said diodes;

a bias switching circuit for selecting and controlling one of said diodes for said frequency converting by switching the polarities of the bias currents supplied to said bias terminals; and a common intermediate frequency signal output for outputting said intermediate frequency signal corresponding to the microwave signal selected at said bias switching circuit from the cathodes of said diodes.

5. A microwave mixing circuit comprising:

plural microstrip lines for inputting different microwave signals;

a plurality of diodes, each with an anode coupled to a terminal end of a respective one of the microstrip lines for frequency converting one of said input microwave signals to an intermediate frequency signal which is at one of the output cathodes of said diodes;

bias terminals for supplying a bias current to the anodes and cathodes of the diodes, a bias switching circuit for selecting and controlling one of said diodes for said frequency converting by switching a polarity of the bias current supplied to the bias terminals; and a common intermediate frequency signal output coupled with the cathodes of said diodes for obtaining an intermediate frequency signal corresponding to the microwave signal selected at said bias switching circuit.

6. A down converter comprising:

probes for converting a microwave signal within a band of 12 GHz to a transverse electromagnetic wave;

plural low noise amplifiers for amplifying the signals converted at said probes;

plural microstrip lines for inputting different microwave signals;

a plurality of diodes each with anodes coupled to a respective terminal end of the microstrip lines, for frequency converting one of said input microwave signals to an intermediate frequency signal which is output at one of the cathodes of said diodes;

bias terminals for supplying a bias current to the anodes and cathodes of the diodes;

a bias switching circuit for selecting and controlling one of said diodes for said frequency converting by switching a polarity of the bias current supplied to the bias terminals; and a common intermediate frequency signal output for outputting from the cathodes of said diodes said intermediate frequency signal corresponding to the microwave signal selected at said bias switching circuit.

7. A microwave mixing circuit comprising:

plural microstrip lines for inputting different microwave signals;

plurality of diodes, each with cathodes coupled with terminal ends of the microstrip lines, for frequency converting one of said input microwave signals of the diodes;

bias terminals for supplying a bias current to the cathodes of the diodes;

a bias switching circuit for selecting and controlling one of said diodes for said frequency converting by switching a polarity of the bias current supplied to the bias terminals; and a common intermediate frequency signal output for outputting from the anodes of said diodes said intermediate frequency signal corresponding to the microwave signal selected at said bias switching circuit.

8. A microwave mixing circuit of claim 7, wherein a Wilkinson-type divider is provided between the anodes of the diodes and the intermediate frequency signal output.

9. A down converter comprising:

probes for converting a microwave signal within a band of 12 GHz to a transverse electromagnetic wave;

plural low noise amplifiers for amplifying the signals converted at said probes;

plural microstrip lines for inputting different microwave signals;

a plurality of diodes, each with cathodes coupled with a respective terminal end of the microstrip lines, for frequency converting one of said input microwave signals to an intermediate frequency signal which is output at one of the cathodes of said diodes;

bias terminals for supplying a bias current to the cathodes of the diodes;

a bias switching circuit for selecting and controlling one of said diodes for said frequency converting by switching a polarity of the bias current supplied to the bias terminals; and a common intermediate frequency signal output coupled with the anodes of said diodes for outputting said intermediate frequency signal corresponding to the microwave signal selected at said bias switching circuit.

10. A microwave mixing circuit comprising:

plural microstrip lines for inputting different microwave signals;

a plurality of diodes, each with cathodes coupled to a respective terminal end of the microstrip lines, for frequency converting one of said input microwave signals to an intermediate frequency signal which is output at one of the cathodes of said diodes;

bias terminals for supplying a bias current to the anodes and the cathodes of the diodes;

a bias switching circuit for selecting and controlling a diode for said frequency converting out of said diodes by switching a polarity of the bias current supplied to the bias terminals; and a common intermediate frequency signal output coupled with the anodes of the diodes for obtaining an intermediate frequency signal corresponding to the microwave signal selected at said bias switching circuit.

11. A down converter comprising:

probes for converting a microwave signal within a band of 12 GHz to a transverse electromagnetic wave;

plural low noise amplifiers for amplifying the signal converted by said probes;

plural microstrip lines for inputting different microwave signals;

a plurality of diodes, each with cathodes coupled with a respective terminal end of the microstrip lines, for frequency converting one of said input microwave signals to an intermediate frequency signal which is output at one of the cathodes of said diodes;

bias terminals for supplying a bias current to anodes and the cathodes of the diodes;

a bias switching circuit for selecting and controlling one of said diodes for said frequency converting by switching a polarity of the bias current supplied to the bias terminals; and a common intermediate frequency signal output from coupled with the anodes of said diodes for outputting said intermediate frequency signal corresponding to the microwave signal selected at said bias switching circuit.

* * * * *

UNITED STATES PATENT AND TRADEMARK OFFICE
CERTIFICATE OF CORRECTION

PATENT NO. : 5,754,951
DATED : May 19, 1998
INVENTOR(S) : Kashima et al.

It is certified that error appears in the above-identified patent and that said Letters Patent is hereby corrected as shown below:

Column 9, line 9, delete ":" and insert --;--.

Column 10, line 7, insert --,-- after "diodes".

Column 12, line 16, delete "from".

Signed and Sealed this

Second Day of February, 1999

Attest:

Attesting Officer

Acting Commissioner of Patents and Trademarks